United States Patent
Schier et al.

(10) Patent No.: US 10,619,236 B2
(45) Date of Patent: Apr. 14, 2020

(54) SOLID-CARBIDE END MILLING CUTTER HAVING A TIALN—ZRN COATING

(71) Applicant: WALTER AG, Tubingen (DE)

(72) Inventors: Veit Schier, Echterdingen (DE); Wolfgang Engelhart, Metzingen (DE)

(73) Assignee: WALTER AG, Tubingen (DE)

(*) Notice: Subject to any disclaimer, the term of this patent is extended or adjusted under 35 U.S.C. 154(b) by 147 days.

(21) Appl. No.: 15/550,412

(22) PCT Filed: Feb. 11, 2016

(86) PCT No.: PCT/EP2016/052891
§ 371 (c)(1),
(2) Date: Aug. 11, 2017

(87) PCT Pub. No.: WO2016/128504
PCT Pub. Date: Aug. 18, 2016

(65) Prior Publication Data
US 2018/0030590 A1    Feb. 1, 2018

(30) Foreign Application Priority Data
Feb. 13, 2015 (EP) .................................. 15155026

(51) Int. Cl.
*C23C 14/34* (2006.01)
*H01J 37/34* (2006.01)
(Continued)

(52) U.S. Cl.
CPC ............ *C23C 14/3485* (2013.01); *B23C 5/16* (2013.01); *C23C 14/0641* (2013.01);
(Continued)

(58) Field of Classification Search
USPC ..... 51/307, 309; 204/192.1, 192.15, 192.16; 428/141, 216, 325, 336, 457, 469, 697,
(Continued)

(56) References Cited

U.S. PATENT DOCUMENTS 7,081,186 B2 * 7/2006 Ehiasarian ............ C23C 14/022
204/192.16
7,758,975 B2   7/2010 Schier
(Continued)

FOREIGN PATENT DOCUMENTS

DE    102010039035 A1    2/2012
DE    102011117994 A1    5/2013
(Continued)

OTHER PUBLICATIONS

Purandare et al "Structure and properties of ZrN coatings deposited by high power impulse magnetron sputtering technology" J. Vac. Sci. Technol. A 29 (1) 011004-1 to 011004-6. (Year: 2011).*

(Continued)

*Primary Examiner* — Archene A Turner
(74) *Attorney, Agent, or Firm* — Corinne R. Gorski

(57) ABSTRACT

A solid carbide milling cutter has a substrate of hard metal and a multi-layer coating deposited at least to surface regions that contact a workpiece during a milling operation. The multi-layer coating includes a single-layer or a multi-layer functional layer deposited directly on the substrate surface and a single-layer or a multi-layer covering layer deposited on the functional layer. The functional layer has one or more layers of $Ti_xAl_{1-x}N$ with $0.3 \leq x \leq 0.55$. The covering layer has one or more layers of ZrN. The functional layer and the covering layer are deposited by HIPIMS, wherein during the deposition of the functional layer power pulses are applied to each sputtering target consisting of material to be deposited, which power pulses transfer an amount of energy to each sputtering target that exceeds a maximum power density in the pulse of $\geq 500$ W/cm$^2$.

17 Claims, 1 Drawing Sheet

(51) Int. Cl.
*C23C 14/06* (2006.01)
*C23C 14/35* (2006.01)
*B23C 5/16* (2006.01)
*C23C 30/00* (2006.01)
*C23C 28/04* (2006.01)

(52) U.S. Cl.
CPC ............ *C23C 14/35* (2013.01); *C23C 28/042* (2013.01); *C23C 28/044* (2013.01); *C23C 30/005* (2013.01); *H01J 37/3426* (2013.01); *H01J 37/3467* (2013.01); *B23C 2222/14* (2013.01); *B23C 2222/84* (2013.01); *B23C 2228/08* (2013.01); *B23C 2228/10* (2013.01)

(58) Field of Classification Search
USPC .................................. 428/698, 699; 407/119
See application file for complete search history.

(56) References Cited

U.S. PATENT DOCUMENTS

| | | | | |
|---|---|---|---|---|
| 8,003,234 B2* | 8/2011 | Omori | ................... | B23B 27/141 51/307 |
| 8,133,576 B2* | 3/2012 | Omori | ................... | B23B 27/141 407/119 |
| 8,709,583 B2 | 4/2014 | Schier et al. | | |
| 2007/0059559 A1* | 3/2007 | Schier | ................ | C23C 14/0641 428/698 |
| 2013/0216804 A1* | 8/2013 | Schier | .................. | C23C 30/005 428/336 |
| 2013/0276984 A1* | 10/2013 | Papa | ..................... | C23C 14/022 156/345.43 |
| 2014/0044946 A1* | 2/2014 | Hirano | ................... | C23C 28/42 428/216 |
| 2014/0305792 A1* | 10/2014 | Krassnitzer | ......... | H01J 37/3467 204/192.12 |
| 2015/0232978 A1* | 8/2015 | Schier | .................. | C23C 30/005 428/141 |

FOREIGN PATENT DOCUMENTS

| | | |
|---|---|---|
| DE | 102012109254 A1 | 4/2014 |
| EP | 1762638 A2 | 3/2007 |
| EP | 2700460 A1 | 2/2014 |
| WO | 2013068080 A1 | 5/2013 |

OTHER PUBLICATIONS

Weichart et al "Titianium aluminum nitride puttered by HIPMIS" IOP Conf. Series: Materials Science & Engineering 39 012001 p. 1-4 (Year: 2012).*

* cited by examiner

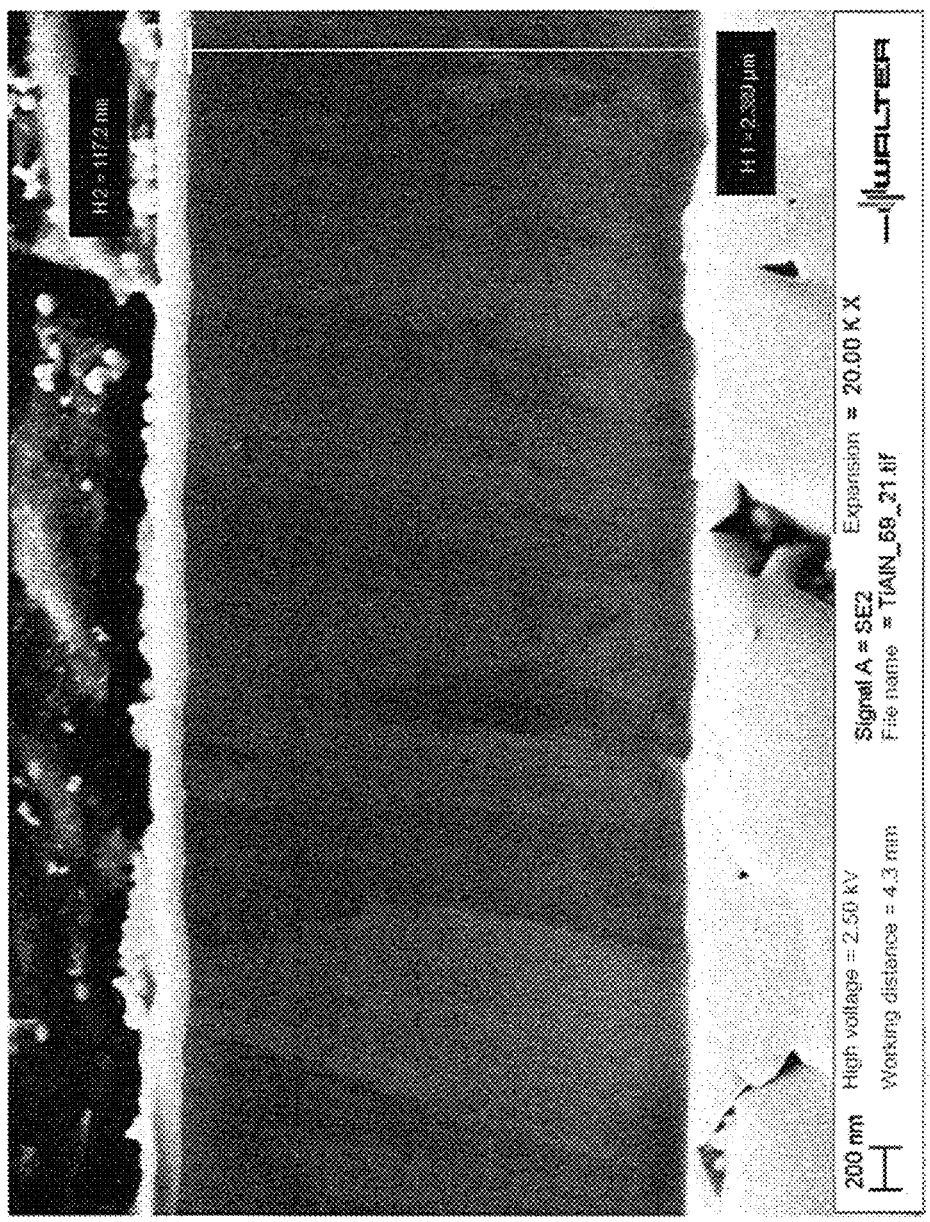

SOLID-CARBIDE END MILLING CUTTER HAVING A TIALN—ZRN COATING

RELATED APPLICATION DATA

This application is a § 371 National Stage Application of PCT International Application No. PCT/EP2016/052891 filed Feb. 11, 2016 claiming priority of EP Application No. 15155026.6, filed Feb. 13, 2015.

OBJECT OF THE INVENTION

The present invention refers to a solid carbide milling cutter (SC milling cutter), having a substrate of hard metal and a multi-layer coating deposited in the PVD process at least to the surface regions coming into contact with a workpiece during the milling operation, wherein the multi-layer coating comprises a single-layer or multi-layer functional layer deposited directly on the substrate surface and a single-layer or multi-layer covering layer deposited on top of the functional layer.

BACKGROUND OF THE INVENTION

Cutting tools such as for example those used for the chip removing metal working as a rule consist of a substrate (base body) of hard metal, cermet, steel or high-speed steel having a wear-resistant single-layer or multi-layer coating of hard metallic substances deposited thereon by means of CVD processes (chemical vapor deposition) or PVD processes (physical vapor deposition). Among the PVD processes a distinction is made between different variants, for example cathode sputtering (sputter deposition), cathodic vacuum arc deposition (arc PVD), ion plating, electron beam evaporation and laser ablation. Cathode sputtering, such as magnetron sputtering, reactive magnetron sputtering and high power impulse magnetron sputtering (HIPIMS) and the arc vapor deposition are among the PVD processes which are most frequently used for the coating of cutting tools.

For the milling with coated solid carbide milling cutter, in particular for the face milling of workpieces of steel, it is particular important that the coating has a high adhesion and low surface roughness in order to obtain good milling results and long service lives. The quality of the coating apart from the composition among others very strongly depends on the coating processes used, wherein most of the processes have advantages and disadvantages which come into effect to a different extent depending on the type of tool, the material of the substrate and the field of application.

In the cathodic vacuum arc deposition (arc PVD), an arc melting and evaporating the target material is burning between the chamber and the target. In the process, a big part of the evaporated material is ionized and accelerated towards the substrate, the substrate having a negative potential (bias potential), and is deposited on the substrate surface. The cathodic vacuum arc deposition (arc PVD) is characterized by a high rate of deposition, by dense layer structures, due to a high ionization of the evaporated material, as well as by process stability. Due to the high ionization of the metals, by using the cathodic vacuum arc deposition (arc PVD), a good bonding or adhesion of the deposited layer to the material below is obtained. A substantial disadvantage, however, is the process-dependent deposition of micro particles (droplets) caused by the emission of small metal splashes, the avoidance of which is extremely complex. The droplets lead to an undesirably high surface roughness on the deposited layers. In some applications, this, in turn, leads to an earlier wear of the tool due to increased adherence of the tool surface to the workpiece, increased friction forces and, as a result, increased cutting forces.

In the cathode sputtering process (sputtering), by bombardment with energy-rich ions, atoms or molecules are removed from the target and transferred to the gas phase from which they are deposited on the substrate, either directly or after reaction with a reactive gas. The magnetron-assisted cathode sputtering comprises two major process variants, the classical DC magnetron sputtering (DC-MS) and the HIPIMS process. In the case of magnetron sputtering, the unfavorable formation of droplets in the cathodic vacuum arc evaporation (arc PVD) does not occur. However, in the classical DC-MS the deposition rates are comparatively low in comparison to the cathodic vacuum arc deposition (arc PVD), which implies higher process durations and thus an economic disadvantage.

In the high power impulse magnetron sputtering (HIPIMS), the magnetron is operated at high current densities in the pulsed mode, resulting in an improved layer structure in the form of denser layers, in particular due to an improved ionization of the sputtered material. The current densities at the target in the HIPIMS process typically exceed those of the classical DC-MS. Depending on the material, by means of HIPIMS an ionization of up to 100% of the sputtered particles can be achieved. At the same time, the short-term high powers and discharge current densities, respectively, acting on the target lead to an increased degree of ionization which can alter the growth mechanism and the bonding of the layers to the material below and thus has an influence on the layer properties.

Layers deposited by means of DC-MS and HIPIMS often exhibit noticeable structural differences. DC-MS layers in general grow in a columnar structure on the material below. In the HIPIMS process, on the other hand, fine crystalline as well as granular crystalline layer structures can be achieved, which are characterized by an improved wear behavior and longer service lives, related thereto, in comparison to DC-MS layers. HIPIMS layers are in general harder than the DC-MS layers, but also show disadvantages with regard to their adhesion to many materials below.

Typical peak power densities in a conventional HIPIMS process are in the range of 20 W/cm$^2$. By using special target cooling devices up to 50 W/cm$^2$ can be achieved. The corresponding discharge current densities are thereby in the range of up to 0.2 A/cm$^2$. Theoretically, power densities and hence discharge current densities which are much higher would be possible, however, the mean power which may be applied to a sputtering target is limited by the limited possibilities of cooling the target. Hence, the sputtering power is applied in pulsed form, wherein the pulse duration is chosen to be so short that it does not result in over-temperature due to the mean power acting on the target, whereby the target temperature and the allowed maximum target temperature are very strongly dependent on the target material and its thermal conductivity and mechanical properties. A disadvantage in this respect is that the pulse technology requires extensive technical equipment, since generators are mandatory, which are capable of splitting the power into sputter power pulses over time and space. This is not achieved by conventional generator technology. In the prior art different solutions to this problem are offered, for example in U.S. Pat. No. 6,413,382 and WO 03/006703, which, however, have disadvantages.

WO2012/143087 describes a HIPIMS process which enables to sputter material from a target surface in such a way that the sputtered material is available in an ionized form to high percentage. This is achieved by means of a simple generator, the power of which is distributed to a plurality of magnetron sputtering sources at time intervals, i.e. a sputtering source at a time period is supplied with maximum power while the next sputtering source is supplied with maximum power during the subsequent time period. In this way, high discharge current densities are realized. The pulse power is only temporarily supplied to the individual cathodes so that in the meantime these have the possibility to cool whereby the temperature limit is not exceeded.

WO2013/068080 describes a process for the production of a layer system by means of HIPIMS, whereby by alternatingly applying longer and shorter pulse durations HIPIMS layers are deposited having alternatingly a finer and coarser granularity. Such a layer system having alternating layers is supposed to have good wear properties.

OBJECT OF THE INVENTION

The object of the present invention was to provide a coated solid carbide milling cutter, in particular for end milling, which in comparison to the prior art has a high adhesion of the coating, low surface roughness and high wear resistance and thus longer service lives.

DESCRIPTION OF THE INVENTION

This object is solved according to the invention by a solid carbide milling cutter (SC milling cutter) having a substrate of hard metal and a multi-layer coating applied in the PVD process to at least the surface regions coming into contact with a workpiece during the milling operation, wherein the multi-layer coating comprises a single-layer or multi-layer functional layer deposited directly on the substrate surface and a single-layer or multi-layer covering layer deposited on top of it, wherein
the functional layer consists of one or more layers of $Ti_xAl_{1-x}N$ with $0.3 \leq x \leq 0.55$ and has an overall thickness from 1 µm to 15 µm,
the covering layer consists of one or more layers of ZrN and has an overall thickness of 50 nm to 1 µm and
the functional layer and the covering layer are deposited by means of high power impulse magnetron sputtering (HIPIMS),
wherein during the deposition of the functional layer power pulses are applied in the coating chamber to each sputtering target consisting of material to be deposited, which power pulses transfer an amount of energy to the sputtering target that exceeds a maximum power density in the pulse of $\geq 500$ W/cm².

In a preferred embodiment of the invention the functional layer and the covering layer are deposited by means of high power impulse magnetron sputtering (HIPIMS), wherein during the deposition of the functional layer power pulses are applied in the coating chamber to each sputtering target consisting of material to be deposited, which power pulses transfer an amount of energy to the sputtering target that exceeds a maximum power density in the pulse of $\geq 1000$ W/cm².

In a further preferred embodiment of the invention, the functional layer and the covering layer are deposited by means of high power impulse magnetron sputtering (HIPIMS), wherein during the deposition of the functional layer power pulses are applied in the coating chamber to each sputtering target consisting of material to be deposited, which power pulses have discharge current densities in the pulse of $\geq 1$ A/cm², preferably $\geq 3$ A/cm².

The term "single-layer or multi-layer" functional layer in the sense of the present invention means that the functional layer consists of a single layer or several layers arranged on top of each other of $Ti_xAl_{1-x}N$ with $0.3 \leq x \leq 0.55$. If the functional layer consists of several layers of $Ti_xAl_{1-x}N$ arranged on top of each other, these are preferably deposited from one or more targets having the same composition, for example targets having the composition $Ti_{40}Al_{60}$, so that the several layers arranged on top of each other have the same stoichiometry of $Ti_xAl_{1-x}N$. Such a functional layer in the sense of the present invention is multi-layered, if the functional layer is deposited in several steps of the HIPIMS process having different deposition parameters. A multi-layer functional layer in the sense of the present invention may, however, also comprise several $Ti_xAl_{1-x}N$ layers arranged on top of each other, having different stoichiometries.

The term "single-layer or multi-layer" covering layer in the sense of the present invention means that the covering layer may consist of a single layer or several layers of ZrN arranged on top of each other. If the covering layer exists of several layers of ZrN arranged on top of each other, these are deposited from one or more Zr-targets, however, in several steps of the HIPIMS process having different deposition parameters.

The coating depositioned by means of the HIPIMS process according to the present invention is characterized in that in comparison to known coatings of solid carbide metal cutters it has a particular high adhesion (bonding of the layer to the substrate), low surface roughness and high wear resistance and long service lives of the tool related thereto. It is assumed that the particular high adhesion of the coating to the substrate results from atoms and ions, respectively, impacting with particular high energy on the substrate surface already at the beginning of the HIPIMS coating process during the deposition of the functional layer. The coating has fine layer structures as well as high hardnesses and high moduli of elasticity (module E). A high hardness and a high modulus of elasticity are preferred in many metal working processes. The hardness of the layers deposited in the HIPIMS process can be influenced by the deposition parameters, in particular by adjusting the bias potentials and the type of pulse. A high bias potential in general increases the hardness.

In a further embodiment of the invention, the multi-layer coating has an average surface roughness Ra, measured over a length of 4.8 mm of $\leq 0.12$ µm, preferably $\leq 0.06$ µm. The surface roughness is measured with a roughness measuring device P800 type measuring system of the manufacturer JENOPTIK Industrial Metrology Germany GmbH (formerly Hommel-Etamic GmbH) using the evaluation software TURBO WAVE V7.32, determining the waviness according to ISO 11562, TKU300 sensing device and KE590GD test tip with a scan length of 4.8 mm and measured at a speed of 0.5 mm/s.

In an embodiment of the invention, the functional layer has a Vickers hardness in the range of 2500 HV to 4500 HV, preferably in the range of 3000 HV to 4000 HV. The hardness measurement was performed with a hardness measuring device PICODENTOR® HM500 of Helmut Fischer GmbH, Sindelfingen-Maichingen, Germany, using a Vickers pyramid at a maximum load of 15 mN, with a loading duration and unloading duration of 20 sec and a holding duration of the load of 5 sec. The evaluation of the measurements was carried out according to the Oliver-Pharr method.

In a further embodiment of the invention, the functional layer has a modulus of elasticity (modulus E) in the range of 350 GPa to 550 GPa, preferably of 400 GPa to 500 GPa. As modulus E, herein the reduced modulus E and elastic indentation modulus $EIT/(1-v^2)$, respectively, is indicated.

The coating according to the invention deposited by means of HIPIMS has a significantly smoother surface than for example a coating deposited by means of arc PVD. This has considerable advantages, in particular a decreased adhesion of the tool surface to the workpiece, lower friction forces and thus lower cutting forces, but also a better chip removal.

In a further embodiment of the invention, the single-layer or multi-layer functional layer has an overall thickness of 1 µm to 10 µm, preferably of 1.5 µm to 5 µm, particularly preferably of 2 µm to 3.5 µm. If the functional layer is too thin, the desired effect of the layer is not achieved, namely in particular the wear protection. If the functional layer is too thick, chipping will occur more frequently in the area of the edge, which adversely affects the service life of the tool.

In a further embodiment of the invention, the single-layer or multi-layer covering layer has an overall thickness of 50 nm to 500 nm, preferably of 70 nm to 250 nm, particularly preferably of 80 nm to 150 nm.

The covering layer has a decorative function but also serves as a wear detection, i.e. it indicates by a respective wear if the tool has already been used and with which wear it has been used. In case there are no further layers arranged on top of the covering layer, the ZrN covering layer gives the tool a golden yellow color which may be varied between different color shades by adjusting the HIPIMS process parameters. For example, by respectively adjusting the nitrogen partial pressure in the HIPIMS process, the brightness of the golden yellow shade may be varied. The deposition of the covering layer in the HIPIMS process, similar as the TiAlN layer, has advantages in terms of process control from the deposition of the functional layer to the covering layer. An essential further advantage is, however, the low surface roughness and the particular smooth surface of the covering layer, respectively, associated with the above-described advantages. Moreover, the provision of the ZrN covering layer has tribochemical advantages in machining in particular of titanium alloys being used for example in the aerospace industry and in machining stainless steels. For the deposition of the covering layer, according to the invention, it is not necessary to apply to the sputtering targets consisting of the material to be deposited for the covering layer the high energy amounts necessary for the deposition of the functional layer, which pulses have a maximum power density of $\geq 500$ W/cm$^2$.

The functional layer according to the invention consists of a single-layer or several layers arranged on top of each other of $Ti_xAl_{1-x}N$ with $0.3 \leq x \leq 0.55$. In a further embodiment of the invention $0.35 \leq x \leq 0.45$, particularly preferably x is about 0.4.

In a further embodiment of the invention, the substrate of hard metal has a composition having 9 to 14 wt-% Co, preferably 10 to 13 wt-% Co, particularly preferably 11.5 to 12.5 wt-% Co and 0 to 1.5 wt-% of cubic carbides, preferably 0 to 1.0 wt-%, particularly preferably 0 to 0.5 wt-%, which cubic carbides are selected from TiC, TaC and NbC, and balance WC.

Further it is advantageous according to the invention that the WC in the hard metal substrate has an average grain size of 0.5 to 5 µm, preferably an average grain size of 1.0 to 3.0 µm, particularly preferably an average grain size of 1.0 to 2.0 µm. Carbides with grain sizes of WC in the aforementioned range are also referred to as fine grain grades. Such a fine grain grade in combination with a high content of Co as described above provides a tool with a high hardness and toughness, which is particularly advantageous for the end milling of ISO P workpieces characterize according to ISO 513 (unalloyed and alloyed steel, cast steel, stainless ferritic and martensitic steel, long chipping malleable iron) and ISO M workpieces (stainless steels, cast steel, manganese steel, alloyed gray iron, stainless austenitic steel, cast malleable iron, free-cutting steel).

In a preferred embodiment of the invention, the solid carbide milling cutter is designed as an end milling cutter, particularly preferably as a face milling cutter. In end milling, in particular in face milling, the coating according to the invention is particularly advantageous, these applications having particular high requirements in terms of a low surface roughness of the tool and a high layer bonding, which the tool according to the invention fulfills.

The invention also encompasses a method for the production of the herein described coated solid carbide milling cutters with the steps of:

Providing a substrate of hard metal with a multi-layer coating at least to the surface regions that come into contact with a workpiece during the milling operation wherein the multi-layer coating comprises a single-layer or multi-layer functional layer deposited directly onto the substrate surface and a single-layer or multi-layer covering layer deposited above, wherein the functional layer of one or more layers of $Ti_xAl_{1-x}N$ with $0.3 \leq x \leq 0.55$ and having an overall thickness from 1 µm to 15 µm is deposited by means of high power impulse magnetron sputtering (HIPIMS), the covering layer consisting of one or more layers of ZrN and having an overall thickness of 50 nm to 1 µm is deposited by means of high power impulse magnetron sputtering (HIPIMS), wherein during the deposition of the functional layer power pulses are applied in the coating chamber to each sputtering target consisting of material to be deposited, which power pulses transfer an amount of energy to the sputtering target that exceeds a maximum power density in the pulse of $\geq 500$ W/cm$^2$.

In a preferred embodiment of the process according to the invention during the deposition of the functional layer power pulses are applied in the coating chamber to each sputtering target consisting of material to be deposited, which power pulses transfer an amount of energy to the sputtering target that exceeds a maximum power density of $\geq 1000$ W/cm$^2$.

In a further preferred embodiment of the process according to the invention, during the deposition of the functional layer power pulses are applied in the coating chamber to each sputtering target consisting of material to be deposited, which power pulses have discharge current densities of $\geq 1$ A/cm$^2$, preferably $\geq 3$ A/cm$^2$.

Further, the invention encompasses the use of the solid carbide milling cutter coated according to the invention as defined herein and in the claims, for end milling, preferably for face milling of steel workpieces, particularly preferably for end milling or face milling of ISO P workpieces characterized according to ISO 513 (unalloyed or alloyed steel, cast steel, stainless ferritic or martensitic steel, long chipping malleable iron) and ISO M workpieces (stainless steels, cast steel, manganese steel, alloyed gray iron, stainless austenitic steel, cast malleable iron, free-cutting steel) as well as ISO S workpieces.

EXAMPLES

Example 1

Production of a Solid Carbide Milling Cutter According to the Invention

For the production of a solid carbide milling cutter according to the invention, a hard metal substrate of a WC fine grain grade having 12 wt-% Co and having a respective geometry of a milling cutter (diameter: 10 mm, number of teeth: 4; length of the overall tool (adapter and tool): 124.3 mm, projecting length of the tool: 32 mm) was coated in the HIPIMS process with a multi-layer TiAlN-functional layer and a multi-layer ZrN covering layer.

The coatings were produced in a 6-flange PVD facility INGENIA S3p (Oerlikon Balzers Coating AG, Balzers, Liechtenstein). The substrates were rotated on rotating plates. A special plasma generator of the company Oerlikon Balzers was used for the HIPIMS process applying the pulse power sequentially to different cathodes. $Ti_{40}Al_{60}$ targets with a weight of 760 g each were used at reactor positions 4, 5, and 6 as well as Zr targets with a weight of 1400 g each at reactor positions 1, 2, and 3. The $N_2$ partial pressure was adapted to the working point according to the weights of the targets. The coating parameters are given in the following table 1. The multi-layer TiAlN functional layer according to the invention had an overall layer thickness of 2.5 μm and the multi-layer ZrN coating layer had an overall layer thickness of 0.3 μm.

For the TiAlN functional layer a Vickers hardness of 3500 HV and a modulus E of 450 GPa was measured.

FIG. 1 shows a scanning electron micrograph of the coating in a cross-section on a substrate for laboratory analysis.

Deposition Parameters:
  Evaporator current: 160 A
  Total pressure: 4 Pa $N_2$
  Bias potential: DC, 60V The arc PVD coating had a good bonding to the substrate, however, also a comparatively high surface roughness.

Comparative Example 2

Production of a Solid Carbide Milling Cutter with a Single-layer HIPIMS-coating

In this comparative example on the same hard metal substrate for a solid carbide metal cutter as in example 1 a single-layer TiAlN layer having a thickness of 2.5 μm was deposited by means of HIPIMS in a PVD installation HTC100 (Hauzer, Venlo, Netherlands). Thereby the following reaction parameters were used:
Targets: 2× TiAl (33:67), rectangular, 1800×200 mm, reactor positions 3 and 6 (opposite)
Deposition parameters
  Average power: 15 kW (per target)
  Bias potential: DC, 100V
  Peak power: 200 kW
  Peak current: 170 A
  Pulse file: No. 60
  Total pressure: 0.5 Pa $N_2$/Ar

TABLE 1

Coating parameters

| | Layer 1 | Layer 2 | Layer 3 | Layer 4 | Layer 5 | Layer 6 |
|---|---|---|---|---|---|---|
| Target (active) | $Ti_{40}Al_{60}$ | $Ti_{40}Al_{60}$ | $Ti_{40}Al_{60}$ | Zr | Zr | Zr |
| Pulse pattern: | | | | | | |
| $T_{on}$ [ms] | 4 | 4 | 4 | 1 | 1 | 1 |
| $T_{del}$ [ms] | −0.01 | −0.01 | −0.01 | −0.01 | −0.01 | −0.01 |
| <$P_{puls}$> [kW] | 4.788 | 4.788 | 4.788 | 1.59 | 1.59 | 1.59 |
| $P_{overall, sputter}$ [kW] | 60 | 60 | 60 | 1 | 1 after 9 | 9 |
| Ar [Pa] | 0.43 set | 0.43 set | 0.57 set | 0.55 set | 0.5 set | 0.5 set |
| $N_2$ [Pa] | 0.58 controlled | 0.55 controlled | 0.57 controlled | 0.55 controlled | 0.5 controlled | 0.5 controlled |
| Bias [−V] | 40 | 40 | 40 | 40 | 40 | 40 |
| Duration [min] | 40 | 320 | 2 | 0.083 | 4 | 60 |
| Temperature [° C.] | 430 | 430 | 430 | 430 | 430 | 430 |

$T_{on}$ refers to the duration of a single pulse
$T_{del}$ refers to the time shift between the end of a pulse and the beginning of the following pulse at another target
$P_{overall, sputter}$ refers to the power the pulse unit receives
"1 after 9" describes a ramp of 1 kW to 9 kW within the coating time of the layer
Duration refers to the overall duration of the coating of the individual layer.

The values given are average values since the plasma conditions permanently change while the substrate plate is moved.

Comparative Example 1

Production of a Solid Carbide Milling Cutter Having a Single-layer Arc PVD Coating In this comparative example on the same hard metal substrate for a solid carbide milling cutter as in example 1 a single-layer TiAlN layer having the thickness of 2.5 μm was deposited by means of arc PVD in a PVD installation INNOVA (Oerlikon Balzers Coating AG, Balzers, Liechtenstein). Thereby the following reaction parameters were used:
Targets: TiAl (44:56), circular, 160 mm diameter, reactor positions 1 to 6

The HIPIMS coating was very smooth (low surface roughness), however, had a relatively poor bonding to the substrate.

Cutting Trials:
The solid carbide milling cutter produced according to example 1 according to the invention was compared to the solid carbide milling cutters according to comparative examples 1 and 2 in a cutting trial.
Cutting Data:
Cutting speed (Vc): 200 m/min
Tooth feed (fz): 0.075 mm
Cutting depth (ap): 9 mm
Cutting width (ae): 10 mm (full grooves)
Coolant: 20 bar (outside)

The criterion for terminating the cutting trials was a flank wear of the tool of more than 0.2 mm. The results of the cutting tests are given in the following table 2 in terms of milling distance in meters.

TABLE 2

Results of cutting trials

| | Milling distance [m] |
|---|---|
| Example 1 (Invention) | 63 |
| Comparative example 1 | 38 |
| Comparative example 2 | 25 |

The invention claimed is:

1. A solid carbide milling cutter comprising:
a substrate of hard metal having a surface; and
a multi-layer coating applied to the substrate in a PVD process to at least surface regions of the cutter coming into contact with a work piece during a milling operation, wherein the multi-layer coating includes a single-layer or a multi-layer functional layer deposited directly on the substrate surface and a single-layer or a multi-layer covering layer deposited on top of the functional layer, wherein the functional layer has one or more layers of $Ti_xAl_{1-x}N$ with $0.3 \leq x \leq 0.55$ and having an overall thickness from 1 μm to 15 μm, the covering layer having one or more layers of ZrN and an overall thickness of 50 nm to 1 μm, and wherein the functional layer and the covering layer are deposited by high power impulse magnetron sputtering, wherein during the deposition of the functional layer power pulses are applied in a coating chamber to sputtering targets of material to be deposited, which power pulses transfer an amount of energy to each sputtering target that exceeds a maximum power density in the pulses of $\geq 500$ W/cm$^2$.

2. The solid carbide milling cutter according to claim 1, wherein during the deposition of the functional layer power pulses are applied in the coating chamber to each sputtering target consisting of material to be deposited, which power pulses transfer an amount of energy to each sputtering target that exceeds a maximum power density in the pulse of $\geq 1000$ W/cm$^2$.

3. The solid carbide milling cutter according to claim 1, wherein during the deposition of the functional layer power pulses are applied in the coating chamber to each sputtering target consisting of material to be deposited, which power pulses have discharge current densities in the pulse of $\geq 1$ A/cm$^2$.

4. The solid carbide milling cutter according to claim 1, wherein the single-layer or multi-layer functional layer has an overall thickness of 1 μm to 10 μm.

5. The solid carbide milling cutter according to claim 1, wherein the single-layer or multi-layer covering layer has an overall thickness of 50 nm to 500 nm.

6. The solid carbide milling cutter according to claim 1, wherein the functional layer includes a single-layer or several layers of $Ti_xAl_{1-x}N$ with $0.35 \leq x \leq 0.45$.

7. The solid carbide milling cutter according to claim 1, wherein the multi-layer coating has an average surface roughness Ra, measured over a length of 4.8 mm of $\leq 0.12$ μm.

8. The solid carbide milling cutter according to claim 1, wherein the functional layer has a Vickers hardness in the range of 2500 HV to 4500 HV.

9. The solid carbide milling cutter according to claim 1, wherein the functional layer has a modulus of elasticity (modulus E) in the range of 350 GPa to 550 GPa.

10. The solid carbide milling cutter according to claim 1, wherein the substrate of hard metal has a composition having 9 to 14 wt-% Co, and 0 to 1.5 wt-% of cubic carbides, which cubic carbides are selected from TiC, TaC and NbC, and the balance WC.

11. The solid carbide milling cutter according to claim 1, wherein the WC in the hard metal substrate has an average grain size of 0.5 to 5 μm.

12. The solid carbide milling cutter according to claim 1, wherein the solid carbide milling cutter is an end milling cutter or a face milling cutter.

13. A method for the production of a coated solid carbide milling cutter comprising the steps of:
providing a substrate of hard metal having a surface; and
applying a multi-layer coating to the substrate via a PVD process at least to surface regions of the cutter that come into contact with a workpiece during a milling operation, wherein the multi-layer coating includes a single-layer or multi-layer functional layer deposited directly onto the substrate surface and a single-layer or multi-layer covering layer deposited above the functional layer, wherein the functional layer of one or more layers of $Ti_xAl_{1-x}N$ with $0.3 \leq x \leq 0.55$ and having an overall thickness from 1 μm to 15 μm is deposited by high power impulse magnetron sputtering, the covering layer of one or more layers of ZrN and having an overall thickness of 50 nm to 1 μm is deposited by high power impulse magnetron sputtering, wherein during the deposition of the functional layer power pulses are applied in a coating chamber to sputtering targets of material to be deposited, which power pulses transfer an amount of energy to each sputtering target that exceeds a maximum power density in the pulses of $\geq 500$ W/cm$^2$.

14. The method according to claim 13, wherein during the deposition of the functional layer power pulses are applied in the coating chamber to each sputtering target consisting of material to be deposited, which power pulses transfer an amount of energy to the sputtering target that exceeds a maximum power density in the pulse of $\geq 1000$ W/cm$^2$.

15. The method according to claim 13, wherein during the deposition of the functional layer power pulses are applied in the coating chamber to each sputtering target consisting of material to be deposited, which power pulses have discharge current densities in the pulse of $\geq 1$ A/cm$^2$.

16. A use of a coated solid carbide milling cutter according to claim 1, for end milling or face milling.

17. The use of the coated solid carbide milling cutter according to claim 16, for end milling or face milling of steel workpieces selected from the group of ISO P workpieces characterized according to ISO 513 selected from unalloyed or alloyed steel, cast steel, stainless ferritic or martensitic steel, long chipping malleable iron, ISO M workpieces selected from stainless steels, cast steel, manganese steel, alloyed gray iron, stainless austenitic steel, cast malleable iron, free-cutting steel, and ISO S workpieces.

* * * * *